US011004963B2

(12) United States Patent
Spulber et al.

(10) Patent No.: US 11,004,963 B2
(45) Date of Patent: May 11, 2021

(54) INSULATED GATE BIPOLAR TRANSISTOR HAVING FIRST AND SECOND FIELD STOP ZONE PORTIONS AND MANUFACTURING METHOD

(71) Applicant: Infineon Technologies AG, Neubiberg (DE)

(72) Inventors: Oana Julia Spulber, Neubiberg (DE); Matthias Kuenle, Villach (AT); Wolfgang Roesner, Ottobrunn (DE); Christian Philipp Sandow, Haar (DE); Christoph Weiss, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/202,567

(22) Filed: Nov. 28, 2018

(65) Prior Publication Data

US 2019/0165151 A1 May 30, 2019

(30) Foreign Application Priority Data

Nov. 29, 2017 (DE) .......................... 102017128243.2

(51) Int. Cl.
| | |
|---|---|
| *H01L 29/739* | (2006.01) |
| *H01L 29/66* | (2006.01) |
| *H01L 21/265* | (2006.01) |
| *H01L 29/06* | (2006.01) |
| *H01L 29/10* | (2006.01) |
| *H01L 29/32* | (2006.01) |
| *H01L 29/36* | (2006.01) |
| *H01L 29/40* | (2006.01) |
| *H01L 29/08* | (2006.01) |

(52) U.S. Cl.
CPC .... *H01L 29/7395* (2013.01); *H01L 21/26513* (2013.01); *H01L 29/0615* (2013.01); *H01L 29/1095* (2013.01); *H01L 29/32* (2013.01); *H01L 29/36* (2013.01); *H01L 29/66333* (2013.01); *H01L 29/0834* (2013.01); *H01L 29/402* (2013.01); *H01L 29/7397* (2013.01)

(58) Field of Classification Search
CPC .......................... H01L 29/732; H01L 29/7395
USPC .................................. 257/487, 565, E29.198
See application file for complete search history.

(56) References Cited

U.S. PATENT DOCUMENTS

| | | | |
|---|---|---|---|
| 5,653,803 A | * | 8/1997 | Ito .......................... H01L 21/304 117/101 |
| 6,271,061 B1 | | 8/2001 | Frisina et al. |

(Continued)

FOREIGN PATENT DOCUMENTS

DE 102016111844 A1 12/2017

*Primary Examiner* — Jonathan Han
(74) *Attorney, Agent, or Firm* — Murphy, Bilak & Homiller, PLLC (57) ABSTRACT

An embodiment relates to a method of manufacturing an insulated gate bipolar transistor in a semiconductor body. A first field stop zone portion of a first conductivity type is formed on a semiconductor substrate. A second field stop zone portion of the first conductivity type is formed on the first field stop zone portion. A drift zone of the first conductivity type is formed on the second field stop zone portion. A doping concentration in the drift zone is smaller than $10^{13}$ cm$^{-3}$ along a vertical extension of more than 30% of a thickness of the semiconductor body upon completion of the insulated gate bipolar transistor.

25 Claims, 6 Drawing Sheets

(56) References Cited

U.S. PATENT DOCUMENTS

| | | | |
|---|---|---|---|
| 8,354,709 B2 | 1/2013 | Schulze et al. | |
| 2006/0081923 A1* | 4/2006 | Mauder | H01L 29/7395 257/335 |
| 2009/0134405 A1* | 5/2009 | Ota | H01L 29/872 257/77 |
| 2013/0277793 A1* | 10/2013 | Lee | H01L 29/0615 257/487 |
| 2014/0231910 A1* | 8/2014 | Willmeroth | H01L 29/7395 257/339 |
| 2015/0069462 A1* | 3/2015 | Mizushima | H01L 29/36 257/139 |
| 2016/0211356 A1 | 7/2016 | Yoshimura et al. | |
| 2016/0240644 A1* | 8/2016 | Muller | H01L 27/0727 |

* cited by examiner

FIG 7

INSULATED GATE BIPOLAR TRANSISTOR HAVING FIRST AND SECOND FIELD STOP ZONE PORTIONS AND MANUFACTURING METHOD

BACKGROUND

Insulated gate bipolar transistor (IGBTs) are designed to meet a variety of demands, for example regarding operation losses, blocking voltage, oscillation behavior during turn-off and cosmic ray robustness. When improving certain device characteristics by adjusting specific layout parameters, this may lead to a negative impact on other device characteristics. Thus, IGBT design may require a trade-off between demands on different device characteristics.

It is thus desirable to improve an insulated gate bipolar transistor and a method of manufacturing an insulated gate bipolar transistor semiconductor comprising a field stop zone that allows for an improved trade-off between device characteristics.

SUMMARY

The present disclosure relates to a method of manufacturing an insulated gate bipolar transistor in a semiconductor body. The method comprises forming a first field stop zone portion of a first conductivity type on a semiconductor substrate. The method further comprises forming a second field stop zone portion of the first conductivity type on the first field stop zone portion. The method further comprises forming a drift zone of the first conductivity type on the second field stop zone portion. A doping concentration in the drift zone is smaller than $10^{13}$ cm$^{-3}$ along a vertical extension of more than 30% of a thickness of the semiconductor body upon completion of the insulated gate bipolar transistor.

The present disclosure relates to an insulated gate bipolar transistor. The insulated gate bipolar transistor comprises a drift zone of a first conductivity type in a semiconductor body. The insulated gate bipolar transistor further comprises a first field stop zone portion of the first conductivity type in the semiconductor body. The insulated gate bipolar transistor further comprises a second field stop zone portion of the first conductivity type in the semiconductor body between the drift zone and the first field stop zone portion. A doping concentration in the drift zone is smaller than $10^{13}$ cm$^{-3}$ along a vertical extension of more than 30% of a thickness of the semiconductor body.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

DETAILED DESCRIPTION

In the following detailed description, reference is made to the accompanying drawings, which form a part hereof, and in which are shown by way of illustrations specific embodiments in which the disclosure may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present disclosure includes such modifications and variations. The examples are described using specific language that should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open and the terms indicate the presence of stated structures, elements or features but not preclude the presence of additional elements or features. The articles "a", "an" and "the" are intended to include the plural as well as the singular, unless the context clearly indicates otherwise.

The term "electrically coupled" includes that one or more intervening element(s) adapted for signal transmission may exist between the electrically coupled elements, for example elements that temporarily provide a low-ohmic connection in a first state and a high-ohmic electric decoupling in a second state.

The Figures illustrate relative doping concentrations by indicating "−" or "+" next to the doping type "n" or "p". For example, "n$^-$" means a doping concentration that is lower than the doping concentration of an "n"-doping region while an "n$^+$"-doping region has a higher doping concentration than an "n"-doping region. Doping regions of the same relative doping concentration do not necessarily have the same absolute doping concentration. For example, two different "n"-doping regions may have the same or different absolute doping concentrations.

The term "horizontal" as used in this specification intends to describe an orientation substantially parallel to a first or main surface of a semiconductor substrate or body. This can be for instance the surface of a wafer or a die.

The term "vertical" as used in this specification intends to describe an orientation which is substantially arranged perpendicular to the first surface, i.e. parallel to the normal direction of the first surface of the semiconductor substrate or body.

In this specification, a second surface of a semiconductor substrate or semiconductor body is considered to be formed by the lower or backside surface while the first surface is considered to be formed by the upper, front or main surface of the semiconductor substrate. The terms "above" and "below" as used in this specification therefore describe a relative location of a structural feature to another.

In this specification, n-doped is referred to as first conductivity type while p-doped is referred to as second conductivity type. Alternatively, the semiconductor devices can be formed with opposite doping relations so that the first conductivity type can be p-doped and the second conductivity type can be n-doped.

Figure 1:
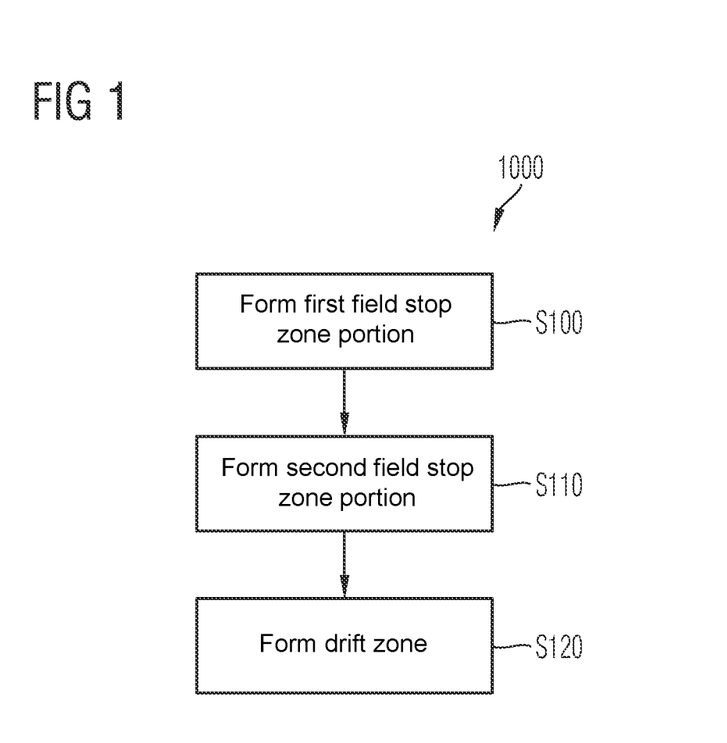
FIG. 1 is a flow-chart illustrating an example of manufacturing an insulated gate bipolar transistor.

FIG. 1 is a schematic flow-chart for illustrating a method 1000 of manufacturing an insulated gate bipolar transistor in a semiconductor body. The semiconductor body has opposite first and second surfaces, for example front and rear surfaces and may include, inter alia and for example, a semiconductor substrate and one or more functional layers such as field stop zone(s) and a drift zone on the semiconductor substrate. During processing of the insulated gate bipolar transistor, a thickness of the semiconductor body may increase due to deposition of layers on the semiconductor substrate.

It will be appreciated that while method 1000 is illustrated and described below as a series of acts or events, the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects of embodiments of the disclosure herein. Also, one or more of the acts depicted herein may be carried out in one or more separate act and/or phases.

Process feature S100 comprises forming a first field stop zone portion of a first conductivity type on a semiconductor substrate. In one or more embodiments, a layer growth process, for example liquid phase epitaxy (LPE), molecular beam epitaxy (MBE) or chemical vapor deposition (CVD) may be used. In one or more embodiments, in-situ doping during the layer growth process may be used to completely or partly set a target doping profile in the first field stop zone portion. One or more doping processes, for example diffusion and/or ion implantation processes may follow to set the doping profile in the first field stop zone portion. In one or more embodiments, proton implantation and annealing may be used to set the doping profile in the first field stop zone portion. One or more proton implantations may be carried out through a second surface, for example a rear surface of the semiconductor body after processing of IGBT elements such as one or more of body, source, gate at the first surface, for example a front surface of the semiconductor body.

The semiconductor substrate may be a semiconductor wafer, for example a silicon wafer. In one or more embodiments, the semiconductor wafer is a silicon wafer obtained by a Czochralski growth process, for example a magnetic Czochralski (MCZ) silicon wafer. According to other embodiments, the semiconductor substrate may be of another single-crystalline semiconductor material such as silicon carbide SiC, gallium arsenide GaAs, gallium nitride GaN or another $A_{III}B_V$ semiconductor, germanium Ge or a silicon germanium crystal SiGe.

Process feature S110 comprises forming a second field stop zone portion of the first conductivity type on the first field stop zone portion. Similar to the first field stop zone portion, in one or more embodiments, a layer growth process, for example liquid phase epitaxy (LPE), molecular beam epitaxy (MBE) or chemical vapor deposition (CVD) may be used to form the second field stop zone portion. In one or more embodiments, in-situ doping during the layer growth process may be used to completely or partly set a target doping profile in the second field stop zone portion. One or more doping processes, for example diffusion and/or ion implantation processes may follow to set the doping profile in the first field stop zone portion. In one or more embodiments, proton implantation and annealing may be used to set the doping profile in the second field stop zone portion. One or more proton implantations may be carried out through a second surface, for example a rear surface of the semiconductor body after processing of IGBT elements such as one or more of body, source, gate at the first surface, for example a front surface of the semiconductor body. In one or more embodiments, the first and second field stop zone portions may be formed in one and the same layer growth equipment, for example in one and the same layer growth reactor such as low pressure or atmospheric pressure chemical vapor deposition (LPCVD or APCVD) chamber.

In one or more embodiments, a maximum doping concentration in the second field stop zone portion is set by in-situ doping.

In one or more embodiments, a maximum doping concentration in the second field stop zone portion is set by a doping peak caused by implantation of dopant ions and activation, for example hydrogen related donors caused by proton implantation and annealing.

In one or more embodiments, setting the doping concentration in the second field stop zone portion comprises setting a constant doping profile along a vertical extension of the second field stop zone portion in a range of 4 to 15 µm. The constant doping profile may be set by in-situ doping during layer growth, for example and may enable relaxation of the electric field strength during turn-off operation and reduction of oscillation behavior.

In one or more embodiments, the method 1000 further comprises setting a ratio of an average doping concentration in the first field stop zone portion to an average doping concentration in the second field stop zone portion in a range of 5 to 30, thereby allowing for stopping an expansion of a space charge region to a second surface, for example rear surface of the semiconductor body during operation conditions of the IGBT.

Process feature S120 comprises forming a drift zone of the first conductivity type on the second field stop zone portion. A doping concentration in the drift zone is set smaller than $10^{13}$ cm$^{-3}$ along a vertical extension of more than 30%, or more than 40% or even more than 50% of a thickness of the semiconductor body upon completion of the insulated gate bipolar transistor. Thus, the vertical extension corresponds to a vertical section in the drift zone that is at least 30% of a thickness of the semiconductor body after processing of the insulated gate bipolar transistor is completed. The thickness of the semiconductor body thus corresponds to a vertical distance between opposite surfaces of the semiconductor body upon completion of the insulated gate bipolar transistor.

In one or more embodiments, the doping concentration in the drift zone is set by a background doping of epitaxial growth equipment having doping gas inlets turned off. Thereby, a doping concentration in the drift zone may be lowered.

In one or more embodiments, setting the doping concentration in the drift zone further comprises counter-doping. By counter-doping, a doping concentration in the drift zone may be further lowered. In one or more embodiments, the first and second field stop zone portions and the drift zone are formed in one and the same epitaxial growth equipment. This may allow for a more precise setting of the doping concentrations of the drift zone and the first and second field stop zone portions relative to each other, for example, thereby enabling a more precise setting of electric field profiles during various operations modes of the device.

In one or more embodiments, embodiments, the epitaxial growth equipment, for example a growth chamber or a growth reactor is purged with H2 gas between formation of the second field stop zone portion and the drift zone. Purging with H2 is used to clean the growth chamber or the growth reactor between formation of the second field stop zone portion and the drift zone, thereby enabling a more precise and steeper transition between a doping concentration in the second field stop zone portion and a comparatively smaller doping concentration in the drift zone.

In one or more embodiments, a ratio of a maximum doping concentration in the second field stop zone portion to a minimum doping concentration in the drift zone is set in a range of 50 to 500, or 20 to 1000. The second field stop zone portion allows for slowing down an expansion of a space charge region through the second and into the first field stop zone portion during turn-off operation of the IGBT.

In one or more embodiments, a gradient of a doping concentration profile in a transition region between the first field stop zone portion and the second field stop zone portion is set smaller than $10^{20}$ dopant atoms/cm$^{-4}$. The gradient of a doping concentration profile in a transition region between the second field stop zone portion and the drift zone may also be set smaller than $10^{20}$ dopant atoms/cm$^{-4}$. This may allow for improved softness.

In one or more embodiments, q1 equals an integral of an ionized dopant charge along a vertical extension of the first field stop zone portion and q2 equals an integral of an ionized dopant charge along a vertical extension of the second field stop zone portion, and a doping concentration profile of the first and second first field stop zone portions is adjusted to set a ratio of q2 to q1 in a range from 1 to 8.

A sum of q1 and q2 may be set smaller than a breakdown charge of the semiconductor body, thereby enabling an effective field stop function of the first and second field stop zone portions. In one or more embodiments, q1 is set smaller than 60% of a breakdown charge of the semiconductor body.

In one or more embodiments, the method further comprises thinning the semiconductor body by removing material of the semiconductor substrate from a second surface of the semiconductor body opposite to the first surface. Material removal may be carried out by using mechanical material removal, for example lapping and polishing, chemical etching, plasma etching or laser ablation. In one or more embodiments, thinning is carried out after formation of IGBT doping regions at the first surface, for example after formation of source and body regions at the first surface, or after formation of gate electrode(s) and gate dielectric(s) at the first surface. In one or more embodiments, thinning is carried out before ion implantation of dopant ions at a second surface opposite to the first surface, for example before implanting dopant ions constituting a rear side emitter region of the second formation of the IGBT, or before or after ion implantation of dopant ions for setting a doping profile in the first field stop zone portion, for example.

In one or more embodiments, the method 1000 further comprises setting a doping concentration in a top portion of the drift zone more than five times larger than a minimum doping concentration of the drift zone. This may allow for a decoupling of drift zone concentrations in top parts of the drift zone on the one side that may have an impact on channel region characteristics such as threshold voltage or on voltage blocking capabilities in edge termination regions, and in bulk and lower parts of the drift zone on the other side that may have an impact on the cosmic ray robustness and operation losses, for example.

In some embodiments, the IGBT is a power IGBT of more than 1 A rated maximum load current and a rated load terminal to load terminal breakdown voltage larger than 300V, or larger than 400V, or larger than 600V, or larger than 650V, or larger than 900V, or larger than 1000V, or larger than 1200V, or larger than 1600V, or larger than 1700V, or larger than 3300V, or larger than 4500V, for example 6500V.

Figure 2:
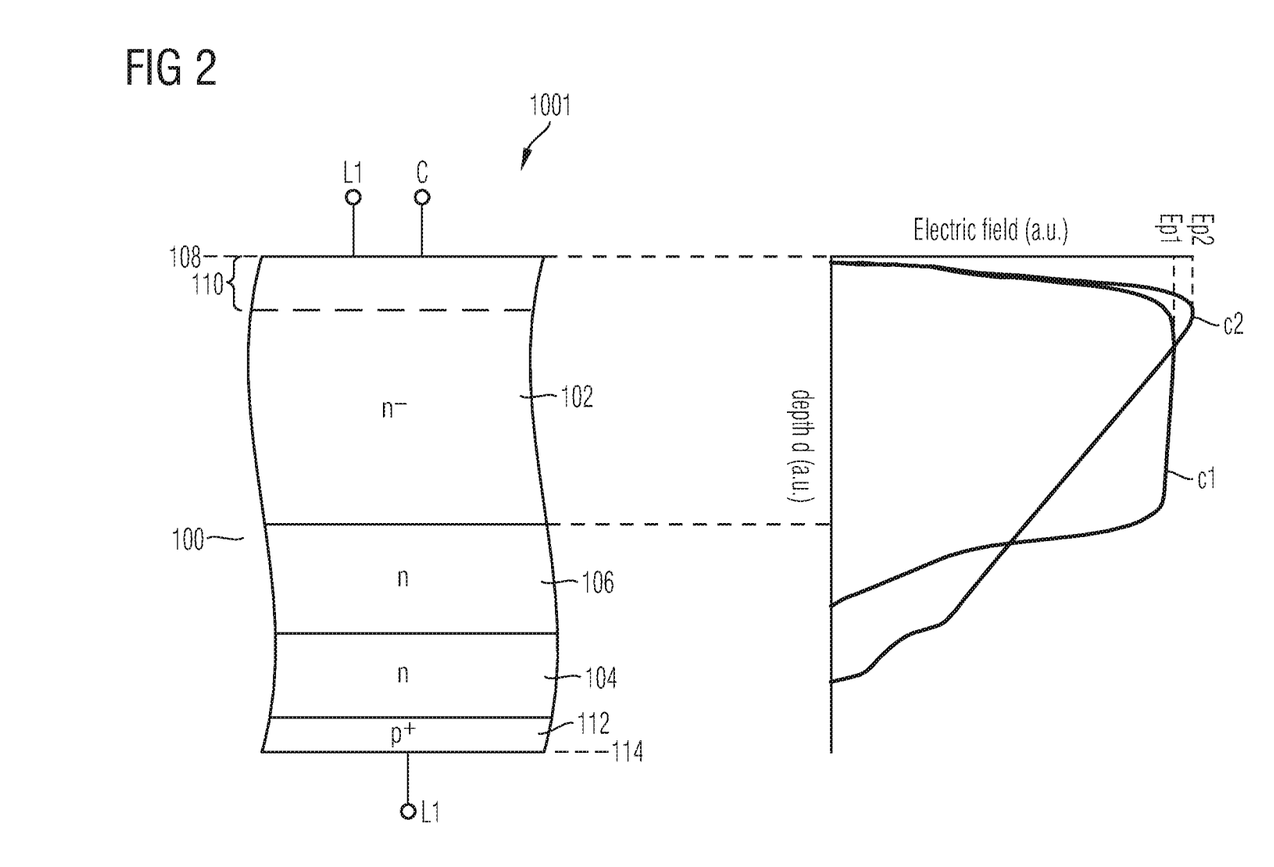
FIGS. 2 to 4 are cross-sectional views illustrating examples of insulated gate bipolar transistors.

FIG. 2 is a cross-sectional view of a semiconductor body 100 for illustrating an example of an insulated gate bipolar transistor 1001. Formation of the IGBT 1001 illustrated in FIG. 2 may comprises process features S100 to S120 described with reference to flow-chart of the method 1000 illustrated in FIG. 1, for example.

The IGBT 1001 comprises an n$^-$-doped drift zone 102 in the semiconductor body 100. The IGBT 1001 further comprises a first n-doped field stop zone portion 104 in the semiconductor body 100. The IGBT 1000 further comprises a second n-doped field stop zone portion 106 between the drift zone 102 and the first field stop zone portion 104. A doping concentration in the drift zone is smaller than $10^{13}$ cm$^{-3}$ along a vertical extension of more than 30% of the thickness of the semiconductor body 100.

The IGBT 1001 further comprises an IGBT top cell portion 110 adjoining the first surface 108. In the IGBT top cell portion, source-, body-, body contact- and further doped semiconductor regions may be formed in any desired top cell design. Depending on the specific top cell design, trenches comprising gate and optional field electrode(s) may be arranged partly or completely in the top cell portion 110. In top cell designs comprising planar gate electrode, gate dielectric(s) and gate electrode(s) may be formed on the semiconductor body 100 at the first surface 108, for example. Depending on the specific top cell design, the drift zone 102 may extend up to the first surface 108, for example in planar gate IGBTs.

The IGBT 1001 further comprises a p$^+$-doped emitter region 112 at a second surface 114 of the semiconductor body 100 opposite to the first surface 108. In one or more embodiments, the IGBT is reverse conducting, i.e. a reverse conducting insulated gate bipolar transistor (RC IGBT) and further comprises n$^+$-doped regions adjoining the second surface 114 between parts of the p$^+$-doped emitter region 112.

The IGBT 1001 further comprises a first load terminal contact L1 electrically coupled to the semiconductor body 100 at the first surface 108. The IGBT further comprises a control terminal contact C electrically coupled to a control electrode, for example a gate electrode in a planar or trench gate structure at the first surface 108. The IGBT further comprises a second load terminal contact L2 electrically coupled to the p$^+$-doped emitter region 112 at the second surface 114 of the semiconductor body 100. Each one of the contacts may include one or more conductive materials, for example metals, alloys, silicides or highly doped semiconductor materials.

A simulated profile of an electric field strength at a blocking voltage Vb along a depth d of the semiconductor body 100 associated with the IGBT 1001 is denoted by c1. A simulated profile of an electric field strength at the blocking voltage Vb associated with a comparative example of an IGBT having a larger doping concentration in the drift zone and a greater substrate thickness is denoted by c2. Lowering the doping concentration in the drift zone 102 to concentration values smaller than $10^{13}$ cm$^{-3}$ along a vertical extension of more than 30% of the thickness of the semiconductor body 100 allows for a reduction of the thickness of the semiconductor body 100 by maintaining cosmic ray robustness due to reduction of an electric field gradient and due to reduction of an electric field peak strength in the drift zone 102. An electric field peak strength Ep2 of the IGBT associated with the profile c2 is larger than an electric field peak strength Ep1 of the IGBT associated with the profile c1. An extension of a space charge region of the IGBT 1001 associated with the profile c1 at the blocking voltage Vb is smaller than an extension of a space charge region of the IGBT associated with the profile c2 at the blocking voltage Vb due to a smaller electric field gradient in the drift zone 102 of the IGBT 1001.

In one or more embodiments, the IGBT 1001 further comprises a doping concentration in a top portion of the drift zone 102, for example in a region of the drift zone 102 adjoining a gate dielectric of a planar gate structure or a trench gate structure is more than twice larger than a minimum doping concentration of the drift zone 102. This may allow for a decoupling of drift zone concentrations in top parts of the drift zone on the one side that may have an impact on channel region characteristics such as threshold voltage or on voltage blocking capabilities in edge termination regions, and in bulk and lower parts of the drift zone on the other side that may have an impact on the cosmic ray robustness and operation losses, for example.

Figure 3:
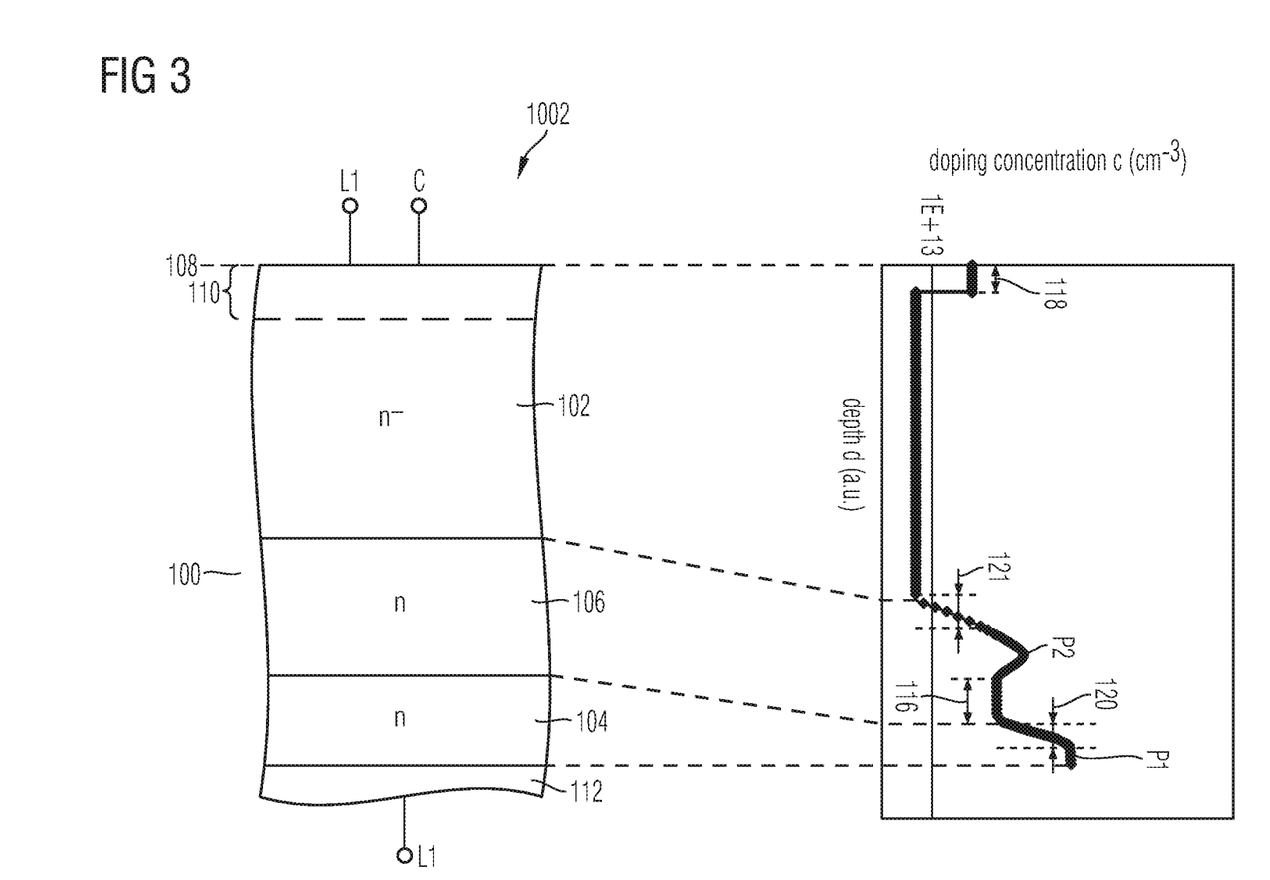

FIG. 3 is a cross-sectional view of the semiconductor body 100 illustrating an example of an insulated gate bipolar transistor 1002. Formation of the IGBT 1002 illustrated in FIG. 3 may comprise process features S100 to S120 described with reference to the flow chart of the method 1000 illustrated in FIG. 1, for example. The IGBT 1001 illustrated in FIG. 2 and the IGBT 1002 illustrated in FIG. 3 are similar with respect to the presence of structural features such as the drift zone 102 and the first and second field stop zone portions 104, 106 that may be manufactured as described with reference to method 1000 illustrated in FIG. 1.

The doping concentration of the drift zone 102 is smaller than $10^{13}$ cm$^{-3}$ along a vertical extension of more than 30% of the thickness of the semiconductor body 100. A maximum doping concentration in the first field stop zone portion 104 is determined by a first doping peak P1. The first doping peak P1 may be formed by ion implantation and activation, for example by proton implantation and annealing. The first doping peak P1 serves to stop an expansion of the space charge region at high blocking voltages that may occur during blocking voltage mode or switching mode. A maximum doping concentration in the second field stop zone portion 106 is determined by a second doping peak P2. The second doping peak P2 may be formed by, for example, epitaxy or ion implantation and activation, for example by proton implantation and annealing. The second doping peak P2 serves to slow down an expansion of the space charge region into the field stop zone in the direction to the second surface 114. The IGBT 1002 further comprises a uniform or constant doping profile section 116 along a vertical extension of the second field stop zone portion 106 between the first and second doping peaks P1, P2. The uniform or constant doping profile section 116 may be formed by in-situ doping during layer growth, for example. A thickness of the uniform or constant doping profile section 116 may be in a range of 4 to 55 µm, for example. The uniform or constant doping profile section 116 serves to enable relaxation of the electric field strength during turn-off and to reduce oscillation behavior. In one or more embodiments, a ratio between a doping concentration of the constant doping profile section 116 and a doping concentration of the drift zone 102 ranges between 20 and 1000. In one or more embodiments, a ratio between a doping concentration of the first doping peak P1 and a doping concentration of the constant doping profile section 116 ranges between 10 and $10^4$.

The IGBT 1002 further comprises a doping concentration in a top portion 118 of the drift zone 102, for example in a region of the drift zone 102 adjoining a gate dielectric of a planar gate structure or a trench gate structure, that is larger than a minimum doping concentration of the drift zone 102. In the example illustrated in FIG. 3, the doping concentration in the top portion 118 is in a range between $1 \times 10^{13}$ cm$^{-3}$ and $5 \times 10^{14}$ cm$^{-3}$. The top portion may have a vertical extension in a range of 2 µm to 15 µm, or in a range of 3 µm to 10 µm, for example. This may allow for a decoupling of drift zone concentrations in top parts of the drift zone that may have an impact on channel region characteristics such as threshold voltage on the one side, and in bulk and lower parts of the drift zone that may have an impact on the cosmic ray robustness and operation losses on the other side.

In one or more embodiments, a gradient of a doping concentration profile in a first transition region 120 between the constant doping profile section 116 and the first doping peak P1 is set smaller than $10^{20}$ dopant atoms/cm$^{-4}$. Likewise, a gradient of a doping concentration profile in a second transition region 121 between constant doping profile section 116 and the drift zone 102 may also be set smaller than $10^{20}$ dopant atoms/cm$^{-4}$. This may allow for improved softness.

Figure 4:
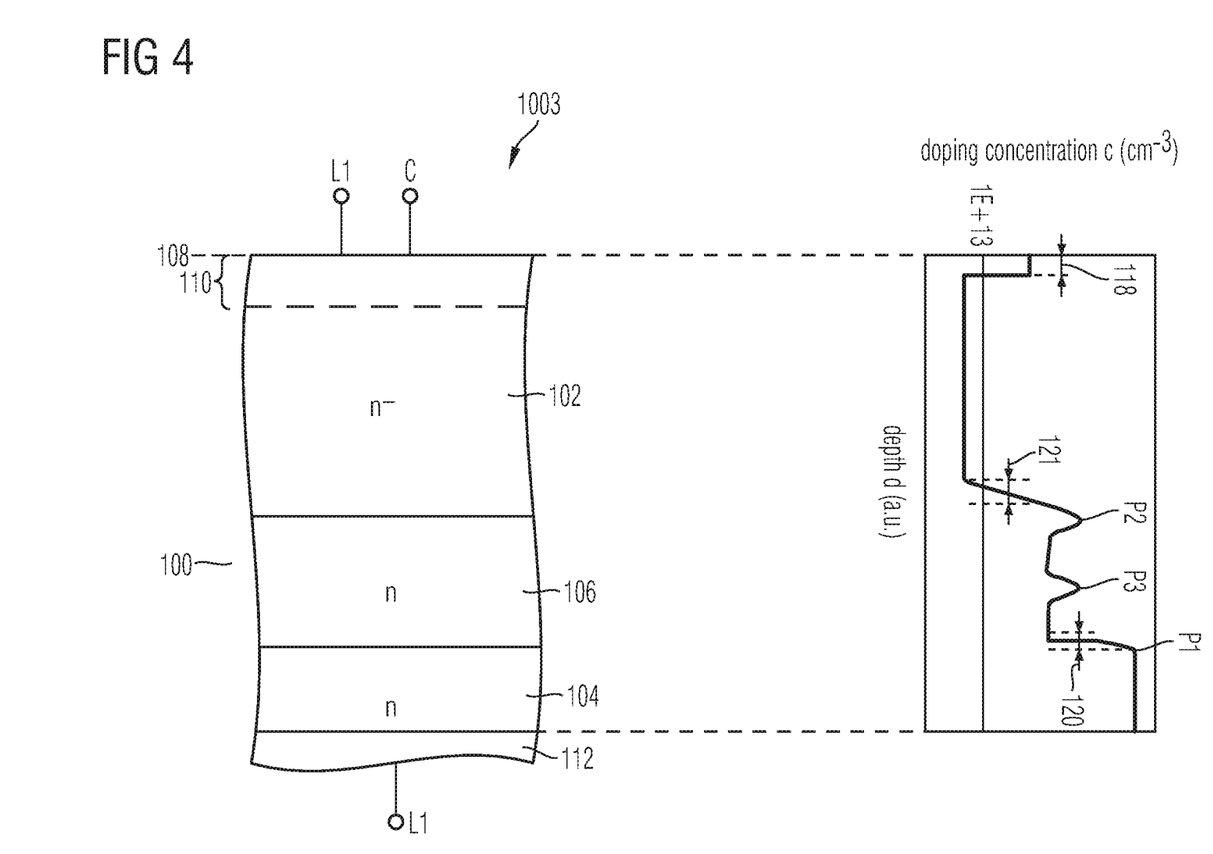

FIG. 4 is a cross-sectional view of a semiconductor body 100 illustrating an example of an insulated gate bipolar transistor 1003. Formation of the IGBT 1003 illustrated in FIG. 4 may comprise process features S100 to S120 described with reference to flow-chart of the method 1000 illustrated in FIG. 1, for example. The IGBT 1001 illustrated in FIG. 2 and the IGBT 1003 illustrated in FIG. 4 are similar with respect to the presence of structural features such as of the drift zone 102 and the first and second field stop zone portions 104, 106 that may be manufactured as described with reference to method 1000 illustrated in FIG. 1.

In addition to structural elements of the IGBT 1002 illustrated in FIG. 3, the IGBT 1003 comprises a third doping peak P3 in the second drift zone portion 106. The third doping peak P3 is arranged between the first doping peak P1 and the second doping peak P2 and may be formed by ion implantation and activation, for example by proton implantation and annealing. The third doping peak P3 may serve to adjust an over-voltage peak during turn-off. The doping concentration c between the first doping peak P1 and the third doping peak P3 may be uniform or constant, for example. Likewise, the doping concentration c between the first doping peak P1 and the third doping peak P3 may be uniform or constant, for example.

The profiles illustrated in FIGS. 2 and 3 are simulation profiles of IGBTs of equal voltage class. FIG. 4 refers to voltage classes of 1200V or higher, but the doping profile in FIG. 3 may also be used at higher voltage classes, for example up to 6.5 kV.

Figure 5:
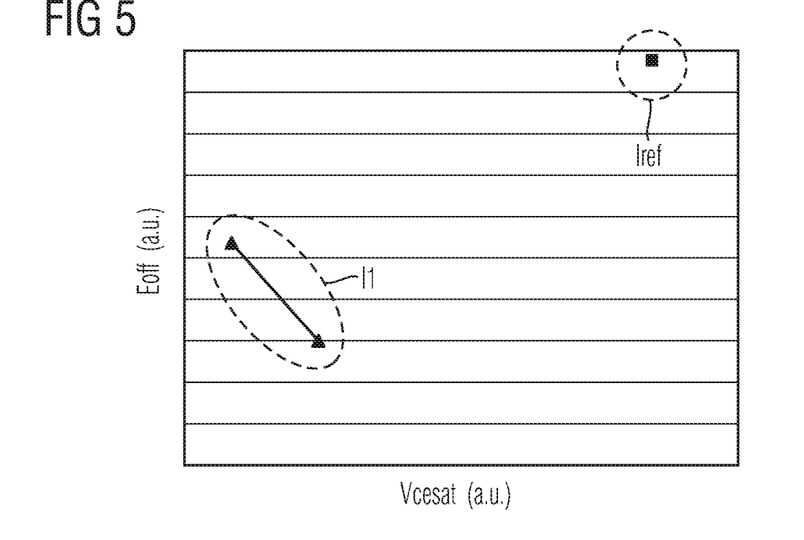
FIG. 5 is a schematic graph illustrating switch-off energy losses Eoff versus conduction losses quantified by collector emitter saturation voltage Vcesat for IGBTs.
Figure 6:
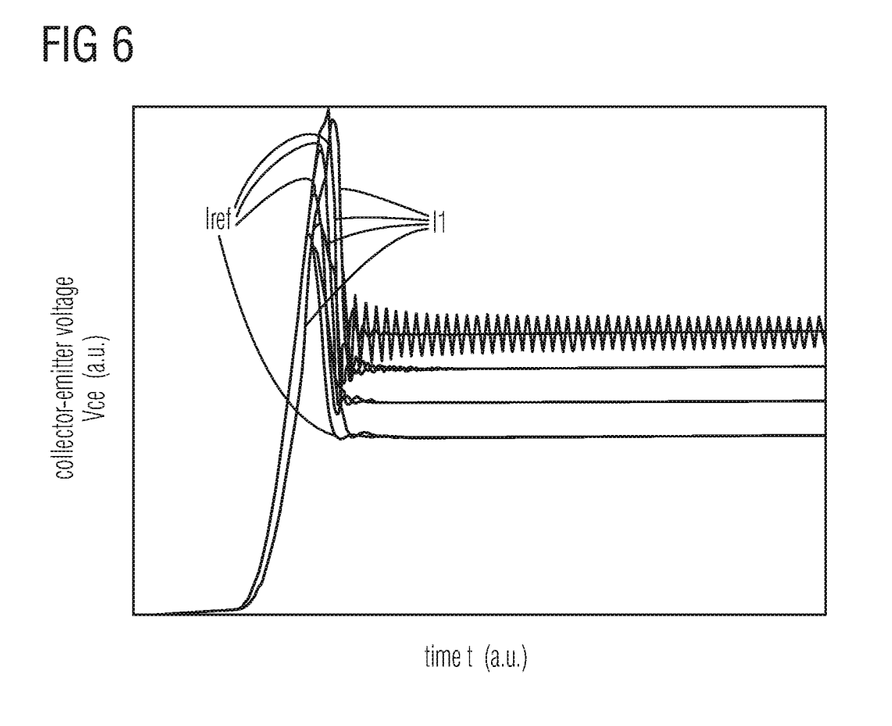
FIG. 6 is a graph illustrating a collector-emitter voltage Vce versus time for different collector-emitter voltage levels of IGBTs.
Figure 7:
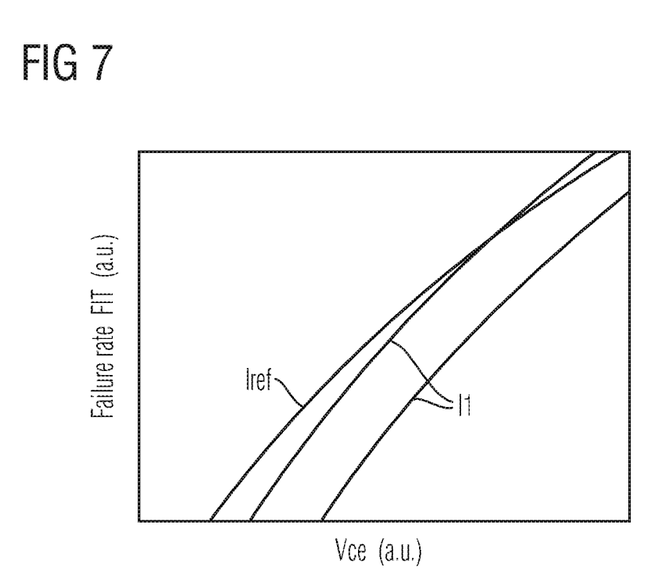
FIG. 7 is a graph illustrating a failure in time FIT rate hours versus a collector voltage Vce of IGBTs.

FIG. 5 is a schematic graph illustrating switch-off energy losses Eoff versus conduction losses quantified by collector emitter saturation voltage Vcesat. Data points associated with IGBTs manufactured by process features S100 to S120 described with reference to flow-chart of the method 1000 are denoted by I1. A thickness of the semiconductor body of the IGBTs denoted by I1 is 17% smaller than a thickness of a reference IGBT denoted by Iref. A doping concentration in the drift zone of the reference IGBT is greater than $10^{13}$ cm$^{-3}$. The IGBTs manufactured by process features S100 to S120 described with reference to the flow-chart of the method 1000 allow for a reduction of switching and conduction losses. The improvement of switching and conduction losses does not lead to a deterioration of oscillation behavior and cosmic ray robustness as will be illustrated with reference to FIGS. 6 and 7. The graph of FIG. 6 illustrates a collector-emitter voltage Vce versus time for different collector-emitter voltage levels. The IGBTs denoted by I1 and the reference IGBT denoted by Iref show a similar oscillation behavior. The graph of FIG. 7 illustrates a failure in time FIT rate being a measure of failure rate in 10$^9$ device hours versus a collector voltage Vce. The IGBTs denoted by I1 and the reference IGBT denoted by Iref show a similar FIT behavior with the IGBTs denoted by I1 being slightly superior.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of manufacturing an insulated gate bipolar transistor in a semiconductor body, the method comprising:
   forming a first field stop zone portion of a first conductivity type on a semiconductor substrate;
   forming a second field stop zone portion of the first conductivity type on the first field stop zone portion; and
   forming a drift zone of the first conductivity type on the second field stop zone portion, wherein a doping concentration in the drift zone is smaller than 10$^{13}$ cm$^{-3}$ along a vertical extension of more than 30% of a thickness of the semiconductor body upon completion of the insulated gate bipolar transistor,
   wherein the doping concentration in the drift zone is set by a background doping of an epitaxial growth equipment having all doping gas inlets turned off during formation of the drift zone.

2. The method of claim 1, wherein the second field stop zone portion and the drift zone are formed in the same epitaxial growth equipment, and wherein the epitaxial growth equipment is purged with H2 gas between formation of the second field stop zone portion and the drift zone.

3. The method of claim 1, wherein a ratio of a maximum doping concentration in the second field stop zone portion to a minimum doping concentration in the drift zone is set in a range of 50:1 to 1000:1.

4. The method of claim 1, wherein a maximum doping concentration in the second field stop zone portion is set by in-situ doping.

5. The method of claim 1, wherein a maximum doping concentration in the second field stop zone portion is set by a doping peak caused by implantation of dopant ions and activation or by in-situ doping.

6. The method of claim 5, wherein setting the doping concentration in the second field stop zone portion comprises setting a constant doping profile along a vertical extension of the second field stop zone portion in a thickness range of 4 to 55 μm.

7. The method of claim 6, wherein a ratio between a doping concentration of the constant doping profile and a minimum doping concentration of the drift zone ranges between 20:1 and 1000:1.

8. The method of claim 1, further comprising setting a doping concentration in a top portion of the drift zone more than twice as large as a minimum doping concentration of the drift zone.

9. The method of claim 1, wherein a gradient of a doping concentration profile in a transition region between the first field stop zone portion and the second field stop zone portion is set smaller than 10$^{20}$ cm$^{-4}$.

10. The method of claim 1, wherein q1 equals an integral of an ionized dopant charge along a vertical extension of the first field stop zone portion and q2 equals an integral of an ionized dopant charge along a vertical extension of the second field stop zone portion, and wherein a doping concentration profile of the first and second first field stop zone portions is adjusted to set a ratio of q2 to q1 in a range from 1 to 8.

11. The method of claim 10, wherein a sum of q1 and q2 is set smaller than a breakdown charge of the semiconductor body.

12. The method of claim 10, wherein q1 is set smaller than 60% of a breakdown charge of the semiconductor body.

13. The method of claim 1, further comprising thinning the semiconductor body by removing material of the semiconductor substrate from a second surface of the semiconductor body opposite to the first surface.

14. The method of claim 1, wherein forming the first field stop zone portion comprises an epitaxial growth process.

15. The method of claim 1, wherein forming the second field stop zone portion comprises an epitaxial growth process.

16. The method of claim 1, wherein forming the drift zone comprises an epitaxial growth process.

17. A method of manufacturing an insulated gate bipolar transistor in a semiconductor body, the method comprising:
   forming a first field stop zone portion of a first conductivity type on a semiconductor substrate;
   forming a second field stop zone portion of the first conductivity type on the first field stop zone portion; and
   forming a drift zone of the first conductivity type on the second field stop zone portion, wherein a doping concentration in the drift zone is smaller than 10$^{13}$ cm$^{-3}$ along a vertical extension of more than 30% of a thickness of the semiconductor body upon completion of the insulated gate bipolar transistor,
   wherein a maximum doping concentration in the second field stop zone portion is set by in-situ doping.

18. The method of claim 17, wherein setting the doping concentration in the drift zone comprises counter-doping.

19. The method of claim 17, further comprising setting a doping concentration in a top portion of the drift zone more than twice as large as a minimum doping concentration of the drift zone.

20. The method of claim 17, wherein the second field stop zone portion and the drift zone are formed in the same epitaxial growth equipment, and wherein the epitaxial growth equipment is purged with H2 gas between formation of the second field stop zone portion and the drift zone.

21. The method of claim 17, wherein q1 equals an integral of an ionized dopant charge along a vertical extension of the first field stop zone portion and q2 equals an integral of an ionized dopant charge along a vertical extension of the second field stop zone portion, and wherein a doping concentration profile of the first and second first field stop zone portions is adjusted to set a ratio of q2 to q1 in a range from 1 to 8.

22. A method of manufacturing an insulated gate bipolar transistor in a semiconductor body, the method comprising:
    forming a first field stop zone portion of a first conductivity type on a semiconductor substrate;
    forming a second field stop zone portion of the first conductivity type on the first field stop zone portion;
    forming a drift zone of the first conductivity type on the second field stop zone portion, wherein a doping concentration in the drift zone is smaller than $10^{13}$ cm$^{-3}$ along a vertical extension of more than 30% of a thickness of the semiconductor body upon completion of the insulated gate bipolar transistor; and
    setting a doping concentration in a top portion of the drift zone more than twice as large as a minimum doping concentration of the drift zone.

23. The method of claim 22, wherein setting the doping concentration in the drift zone comprises counter-doping.

24. The method of claim 22, wherein the second field stop zone portion and the drift zone are formed in the same epitaxial growth equipment, and wherein the epitaxial growth equipment is purged with H2 gas between formation of the second field stop zone portion and the drift zone.

25. The method of claim 22, wherein q1 equals an integral of an ionized dopant charge along a vertical extension of the first field stop zone portion and q2 equals an integral of an ionized dopant charge along a vertical extension of the second field stop zone portion, and wherein a doping concentration profile of the first and second first field stop zone portions is adjusted to set a ratio of q2 to q1 in a range from 1 to 8.

* * * * *